United States Patent
Qi et al.

(10) Patent No.: US 10,327,362 B2
(45) Date of Patent: Jun. 18, 2019

(54) MULTI-CHANNEL POWER SOURCE

(71) Applicant: Delta Electronics (Thailand) Public Company Limited, Samutprakarn (TH)

(72) Inventors: Xuan-Shun Qi, Samutprakarn (TH); Cheng-Feng Yu, Samutprakarn (TH); Bo Shen, Samutprakarn (TH); Hao Lu, Samutprakarn (TH); Kai Dong, Samutprakarn (TH)

(73) Assignee: DELTA ELECTRONICS (THAILAND) PUBLIC COMPANY LIMITED, Samutprakarn (TH)

(*) Notice: Subject to any disclaimer, the term of this patent is extended or adjusted under 35 U.S.C. 154(b) by 0 days.

(21) Appl. No.: 15/485,218

(22) Filed: Apr. 11, 2017

(65) Prior Publication Data

US 2018/0213675 A1  Jul. 26, 2018

(30) Foreign Application Priority Data

Jan. 25, 2017 (CN) .......................... 2017 1 0060651

(51) Int. Cl.
*H05K 7/20* (2006.01)
*H02M 7/00* (2006.01)
*H02M 1/32* (2007.01)

(52) U.S. Cl.
CPC ......... *H05K 7/209* (2013.01); *H05K 7/20909* (2013.01); *H02M 7/003* (2013.01); *H02M 2001/327* (2013.01)

(58) Field of Classification Search
None
See application file for complete search history.

(56) References Cited

U.S. PATENT DOCUMENTS

| | | | |
|---|---|---|---|
| 3,646,400 A * | 2/1972 | Demarest | H01L 23/467 174/16.1 |
| 6,504,714 B1 * | 1/2003 | Richter | H05K 7/20572 361/695 |
| 7,839,641 B2 * | 11/2010 | Baba | H01L 23/24 165/104.19 |
| 8,472,181 B2 * | 6/2013 | Doll | G06F 1/20 361/679.49 |
| 8,472,194 B2 * | 6/2013 | Rivera Hernandez | H05K 7/1471 257/707 |
| 9,084,376 B2 * | 7/2015 | Weiss | H05K 7/20163 |

(Continued)

*Primary Examiner* — Courtney L Smith
(74) *Attorney, Agent, or Firm* — CKC & Partners Co., LLC (57) ABSTRACT

A multi-channel power source includes at least one first power conversion unit, at least one second power conversion unit and a heat dissipation device. The first power conversion unit has a plurality of first subsidiary units. The first subsidiary units are electrically connected with each other. Each of the first subsidiary units has at least one first heating element. The second power conversion unit has a plurality of second subsidiary units. The second subsidiary units are electrically connected with each other. Each of the second subsidiary units has at least one second heating element. The heat dissipation device is configured to dissipate a heat generated by the first heating elements and the second heating elements along at least one heat dissipation medium direction. The first subsidiary units and the second subsidiary units are arranged in an at least partially staggered manner along the heat dissipation medium direction.

12 Claims, 12 Drawing Sheets

(56) References Cited

U.S. PATENT DOCUMENTS

2006/0284308 A1* 12/2006 Harada ................. H01L 25/072
257/729
2013/0285191 A1* 10/2013 Inamura ................. H01L 27/02
257/499

* cited by examiner

MULTI-CHANNEL POWER SOURCE

RELATED APPLICATIONS

This application claims priority to Chinese Application Serial Number 201710060651.3, filed Jan. 25, 2017, which is herein incorporated by reference.

BACKGROUND

Technical Field

The present disclosure relates to power sources. More particularly, the present disclosure relates to power sources with multi-channel power units.

Description of Related Art

During the operation of the power sources with multi-channel power units, the channel power units may all operate at the same period of time, or only some of the channel power units operate while the rest not operate or operate with small power. When all the channel power units operate at the same period of time, a current sharing technology is generally employed to make the power of each of the channel power units become the same, such that the loss and the heat generation of each of the channel power units becomes more even, which facilitates the design of heat dissipation.

However, under the condition that only some of the channel power units operate, the channel power units not operating will not generate any heat, or the channel power units operating with small power will generate only a small amount of heat. Correspondingly, local overheating may easily occur for the channel power units which operate. Thus, how to effectively avoid the problem of uneven distribution of heat generated inside the power source, so as to reduce the loss while maintain the conversion efficiency of the power source, is an important issue in the development of the industry.

SUMMARY

A technical aspect of the present disclosure is to provide a multi-channel power source, which can achieve an even cooling effect as a whole, so as to reduce the loss while increase the conversion efficiency of the multi-channel power source, such that the reliability of the multi-channel power source is effectively improved.

According to an embodiment of the present disclosure, a multi-channel power source includes at least one first power conversion unit, at least one second power conversion unit and a heat dissipation device. The first power conversion unit has a plurality of first subsidiary units. The first subsidiary units are electrically connected with each other. Each of the first subsidiary units has at least one first heating element. The second power conversion unit has a plurality of second subsidiary units. The second subsidiary units are electrically connected with each other. Each of the second subsidiary units has at least one second heating element. The heat dissipation device is configured to dissipate a heat generated by the first heating elements and the second heating elements along at least one heat dissipation medium direction. The first subsidiary units and the second subsidiary units are arranged in an at least partially staggered manner along the heat dissipation medium direction.

In one or more embodiments of the present disclosure, the first subsidiary units and the second subsidiary units are arranged in rows. The first subsidiary units and the second subsidiary units are arranged along a row direction in an at least partially staggered manner.

In one or more embodiments of the present disclosure, the heat dissipation device includes a heat dissipation board. The first subsidiary units and the second subsidiary units are arranged on the heat dissipation board.

In one or more embodiments of the present disclosure, the heat dissipation board has at least one fluid channel within. The fluid channel is configured for allowing a heat dissipation medium to pass through at least along the heat dissipation medium direction.

In one or more embodiments of the present disclosure, the heat dissipation board applies a mode of natural cooling to dissipate the heat generated by the first heating elements and the second heating elements.

In one or more embodiments of the present disclosure, the heat dissipation device includes a fan. The fan is configured for driving a heat dissipation medium to pass through the first heating elements and the second heating elements at least along the heat dissipation medium direction.

In one or more embodiments of the present disclosure, the first heating elements include at least one electromagnetic element.

In one or more embodiments of the present disclosure, the second heating elements include at least one electromagnetic element.

In one or more embodiments of the present disclosure, the first heating elements include at least one power element.

In one or more embodiments of the present disclosure, the second heating elements comprise at least one power element.

In one or more embodiments of the present disclosure, one of the first subsidiary units includes a primary circuit. Another one of the first subsidiary units includes a secondary circuit.

In one or more embodiments of the present disclosure, one of the first subsidiary units includes a plurality of first power elements. Another one of the first subsidiary units includes a plurality of secondary power elements. The first power elements belong to a first circuit or a first topology, and the second power elements belong to a second circuit or a second topology.

In one or more embodiments of the present disclosure, the multi-channel power source further includes at least one third power conversion unit. The third power conversion unit has a plurality of third subsidiary units. The third subsidiary units are electrically connected with each other. Each of the third subsidiary units has at least one third heating element. The first subsidiary units, the second subsidiary units and the third subsidiary units are arranged in an at least partially staggered manner along the heat dissipation medium direction.

In one or more embodiments of the present disclosure, two of the first subsidiary units, the second subsidiary units and the third subsidiary units are arranged along the heat dissipation medium direction in a staggered manner.

When compared with the prior art, the above-mentioned embodiments of the present disclosure have at least the following advantages:

(1) Even if the first power conversion unit and the second power conversion unit do not operate at the same period of time, or one of the first power conversion unit and the second power conversion unit does not operate or only operates with small power, the multi-channel power source is still able to achieve an even cooling effect as a whole. Thus, damage of the multi-channel power source is reduced while the conversion efficiency increased, such that the reliability of the multi-channel power source is effectively improved.

(2) If only the first power conversion unit operates and the second power conversion unit does not operate or operates with small power, before the heat dissipation device carries out the heat dissipation to the first subsidiary unit, the heat dissipation device is not configured to carry out the heat dissipation of the second subsidiary unit located at the upstream of the first subsidiary unit along the heat dissipation medium direction, or the heat dissipation device is configured to carry out the heat dissipation for the tiny heat generated by the second subsidiary unit operating with small power. As a result, the heat dissipation device still has a good cooling effect to the first subsidiary unit of the first power conversion unit.

BRIEF DESCRIPTION OF THE DRAWINGS

The disclosure can be more fully understood by reading the following detailed description of the embodiments, with reference made to the accompanying drawings as follows.

DETAILED DESCRIPTION

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
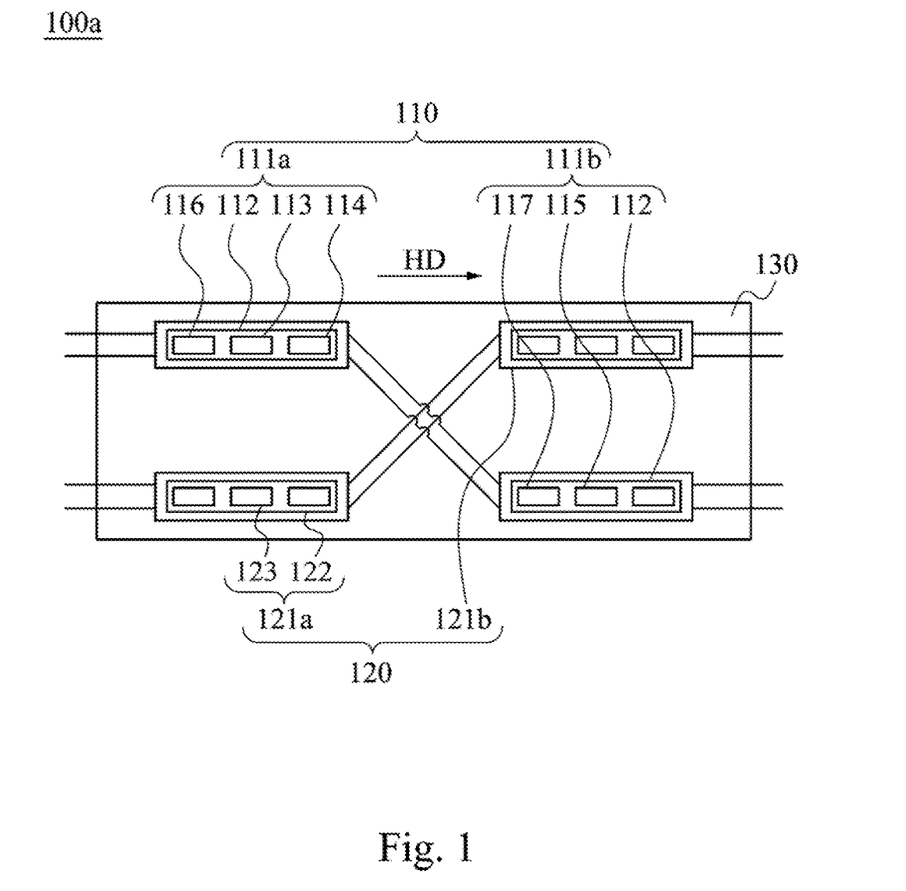
FIG. 1 is a layout diagram of a multi-channel power source according to an embodiment of the present disclosure.

Reference is made to FIG. 1. FIG. 1 is a layout diagram of a multi-channel power source 100a according to an embodiment of the present disclosure. In this embodiment, as shown in FIG. 1, a multi-channel power source 100a includes at least one first power conversion unit 110, at least one second power conversion unit 120 and a heat dissipation device 130. The first power conversion unit 110 has a plurality of first subsidiary units (like the first subsidiary unit 111a and the first subsidiary unit 111b mentioned below). The first subsidiary units are electrically connected with each other. Each of the first subsidiary units has at least one first heating element 112. The second power conversion unit 120 has a plurality of second subsidiary units (like the second subsidiary unit 121a and the second subsidiary unit 121b mentioned below). The second subsidiary units are electrically connected with each other. Each of the second subsidiary units has at least one second heating element 122. The heat dissipation device 130 is configured to dissipate a heat generated by the first heating elements 112 and the second heating elements 122 along at least one heat dissipation medium direction HD. The first subsidiary units and the second subsidiary units are arranged in an at least partially staggered manner along the heat dissipation medium direction HD. In practical applications, the first heating elements 112 include at least one electromagnetic element 113, and the second heating elements 122 include at least one electromagnetic element 123. According to the actual conditions, the first heating elements 112 and the second heating elements 122 can also include semiconductor elements, such as a first power element 116 and a second power element 117.

For example, as shown in FIG. 1, the first power conversion unit 110 has a first subsidiary unit 111a and a first subsidiary unit 111b. The first subsidiary unit 111a and the first subsidiary unit 111b are electrically connected with each other. The first subsidiary unit 111a and the first subsidiary unit 111b respectively have at least one first heating element 112. On the other hand, the second power conversion unit 120 has a second subsidiary unit 121a and a second subsidiary unit 121b. The second subsidiary unit 121a and the second subsidiary unit 121b are electrically connected with each other. The second subsidiary unit 121a and the second subsidiary unit 121b respectively have at least one second heating element 122. In addition, the first subsidiary unit 111b of the first power conversion unit 110 and the second subsidiary unit 121b of the second power conversion unit 120 are mutually exchanged by position, such that the first subsidiary unit 111b of the first power conversion unit 110 and the second subsidiary unit 121b of the second power conversion unit 120 are arranged in a staggered manner at least along the heat dissipation medium direction HD.

When the first power conversion unit 110 and the second power conversion unit 120 operate at the same period of time, since all the first subsidiary unit 111a, the first subsidiary unit 111b, the second subsidiary unit 121a and the second subsidiary unit 121b generate heat, the heat generation of the multi-channel power source 100a become more even. Moreover, the heat generated by the first subsidiary unit 111a, the first subsidiary unit 111b, the second subsidiary unit 121a and the second subsidiary unit 121b, will be dissipated by the heat dissipation device 130 substantially along the heat dissipation medium direction HD.

However, if only one of the first power conversion unit 110 and the second power conversion unit 120 operates, for example, only the first power conversion unit 110 operates and the second power conversion unit 120 does not operate or operates with small power, before the heat dissipation device 130 carries out the heat dissipation to the first subsidiary unit 111b, the heat dissipation device 130 is not configured to carry out the heat dissipation of the second subsidiary unit 121a located at the upstream of the first subsidiary unit 111b along the heat dissipation medium direction HD, or the heat dissipation device 130 is configured to carry out the heat dissipation for the tiny heat generated by the second subsidiary unit 121a operating with small power. As a result, the heat dissipation device 130 still has a good cooling effect to the first subsidiary unit 111b of the first power conversion unit 110. In other words, even if the first power conversion unit 110 and the second power conversion unit 120 of the multi-channel power source 100a do not operate at the same period of time, or one of the first power conversion unit 110 and the second power conversion unit 120 does not operate or only operates with small power, the multi-channel power source 100a is still able to achieve an even cooling effect as a whole. Thus, the loss of the multi-channel power source 100a is reduced while the conversion efficiency increased, such that the reliability of the multi-channel power source 100a is effectively improved.

The situation is the same on the contrary. If only the second power conversion unit 120 operates and the first power conversion unit 110 does not operate or operates with small power, before the heat dissipation device 130 carries out the heat dissipation to the second subsidiary unit 121b, the heat dissipation device 130 is not configured to carry out the heat dissipation of the first subsidiary unit 111a located at the upstream of the second subsidiary unit 121b along the heat dissipation medium direction HD, or the heat dissipation device 130 is configured to carry out the heat dissipation for the tiny heat generated by the first subsidiary unit 111a operating with small power. As a result, the heat dissipation device 130 still has a good cooling effect to the second subsidiary unit 121b of the second power conversion unit 120.

To be more specific, the first subsidiary units (for example, including the first subsidiary unit 111a and the first subsidiary unit 111b) and the second subsidiary units (for example, including the second subsidiary unit 121a and the second subsidiary unit 121b) are arranged in rows along a row direction. The first subsidiary units and the second subsidiary units are arranged in a staggered manner at least partially along the row direction. This means, as mentioned above, the first subsidiary unit 111b of the first power conversion unit 110 and the second subsidiary unit 121b of the second power conversion unit 120 are arranged at least along the row direction in a staggered manner. In this embodiment, the row direction is substantially the same as the heat dissipation medium direction HD.

In the structure of electrical principles, according to the actual loss during operation, the heating element can include an input filter, a rectifier circuit, a power circuit and a primary part of another power circuit. The input filter, the rectifier circuit, the power circuit and the primary part of another power circuit can belong to a primary circuit. Correspondingly, according to the actual loss during operation, the adjacent heating element can include a secondary part of another power circuit, and the secondary part of the other power circuit belongs to a secondary circuit. For example, as shown in FIG. 1, the first heating element 112 of the first subsidiary unit 111a includes a primary circuit 114, and the first heating element 112 of the first subsidiary unit 111b includes a secondary circuit 115.

In practical applications, the first heating element 112 of one of the first subsidiary units, such as the first heating element 112 of the first subsidiary unit 111a, can further include at least one first power elements 116, and the first heating element 112 of another one of the first subsidiary units, such as the first heating element 112 of the first subsidiary unit 111b, can further include at least one second power elements 117. The first power element 116 belongs to a first circuit or a first topology, and the second power element 117 belongs to a second circuit or a second topology. For example, the first power element 116 is assembled in a power module, and the second power element 117 is assembled in another power module. However, this does not intend to limit the present disclosure.

Figure 2:
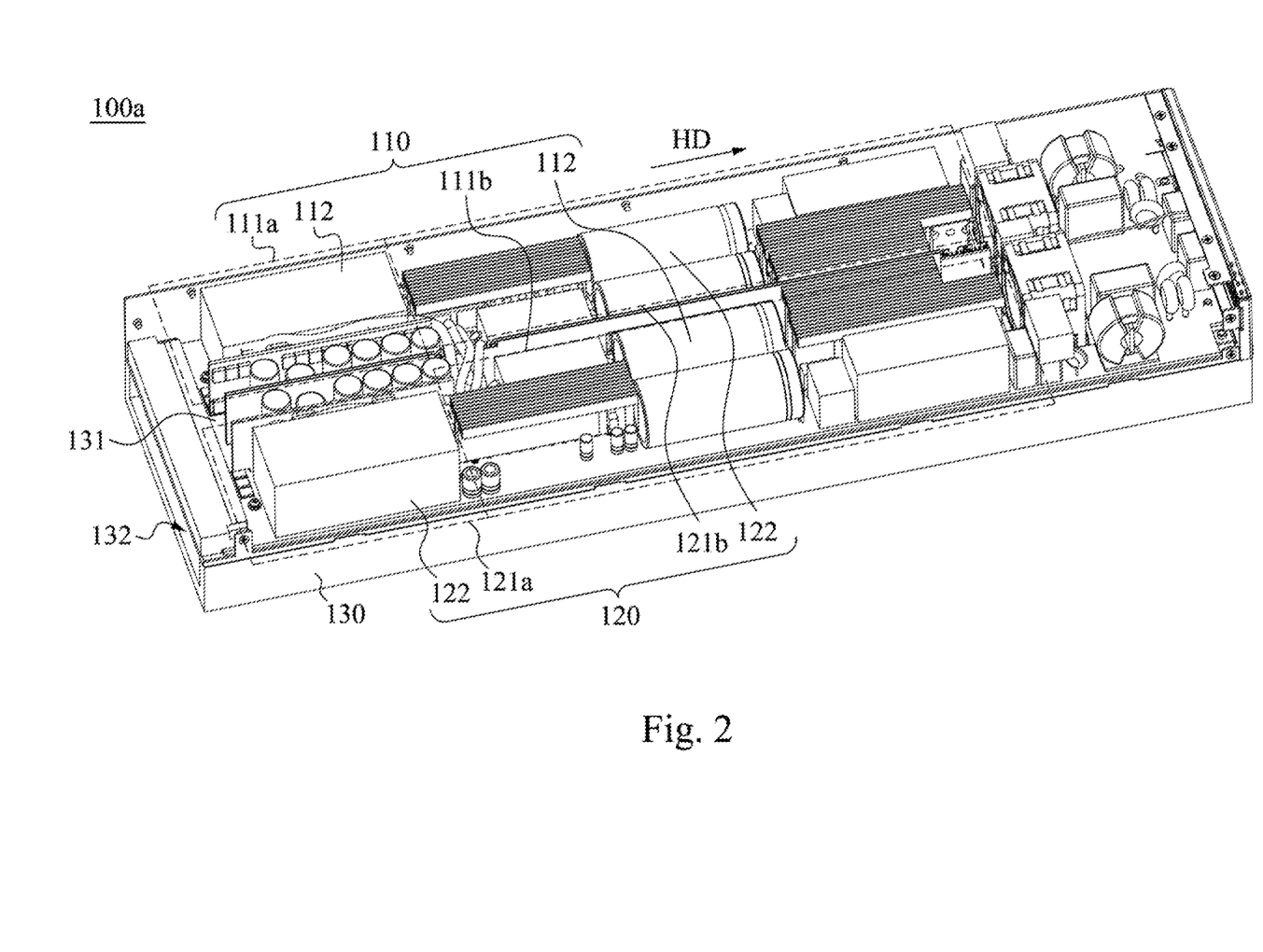
FIG. 2 is a perspective view of the multi-channel power source of FIG. 1.

Reference is made to FIG. 2. FIG. 2 is a perspective view of the multi-channel power source 100a of FIG. 1. Structurally speaking, as shown in FIG. 2, the heat dissipation device 130 includes a heat dissipation board 131. In this embodiment, the first subsidiary units (including the first subsidiary unit 111a and the first subsidiary unit 111b) and the second subsidiary units (including the second subsidiary unit 121a and the second subsidiary unit 121b) are arranged on the heat dissipation board 131. Through the heat transmission along the heat dissipation board 131, the heat generated by the first heating elements 112 and the second heating elements 122 during operation can be delivered away.

In one embodiment, the heat dissipation board 131 has at least one fluid channel 132 within. The fluid channel 132 is configured for allowing a heat dissipation medium (not shown) to pass through at least along the heat dissipation medium direction HD. In this way, the heat dissipation medium is able to deliver away the heat generated by the first heating elements 112 and the second heating elements 122 during operation. For example, the heat dissipation medium can be a liquid coolant. However, this does not intend to limit the present disclosure.

In another embodiment, the heat generated by the first heating elements 112 and the second heating elements 122 during operation can be dissipated by the heat dissipation board 131 applying a mode of natural cooling.

Figure 3:
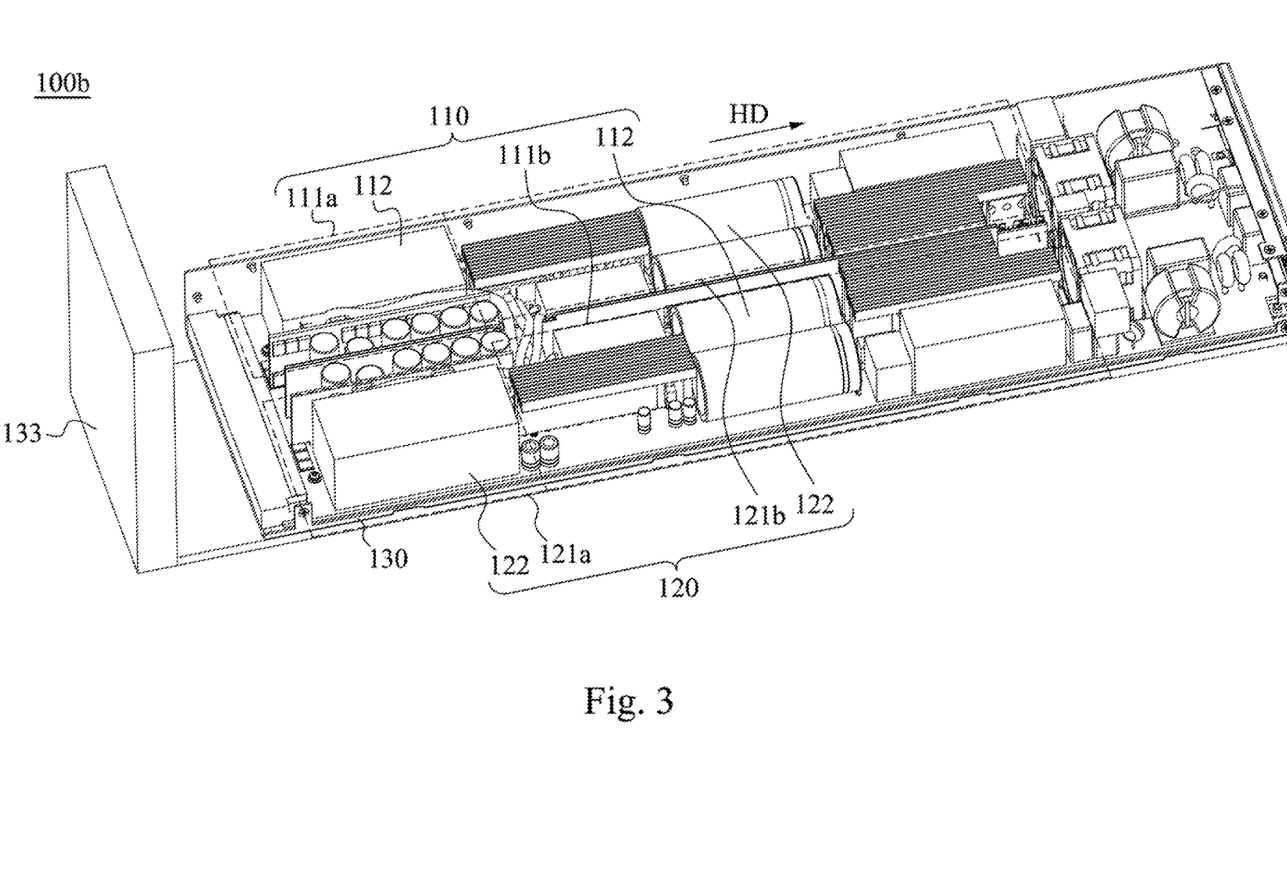
FIG. 3 is a perspective view of a multi-channel power source according to another embodiment of the present disclosure.

Reference is made to FIG. 3. FIG. 3 is a perspective view of a multi-channel power source 100b according to another embodiment of the present disclosure. As shown in FIG. 3, the heat dissipation device 130 includes a fan 133. In this embodiment, the heat dissipation medium is a gas. The fan 133 is configured for driving the heat dissipation medium, such as a cold wind, to pass through the first heating elements 112 and the second heating elements 122 at least along the heat dissipation medium direction HD, so as to deliver away the heat generated by the first heating elements 112 and the second heating elements 122 during operation.

Figure 4:
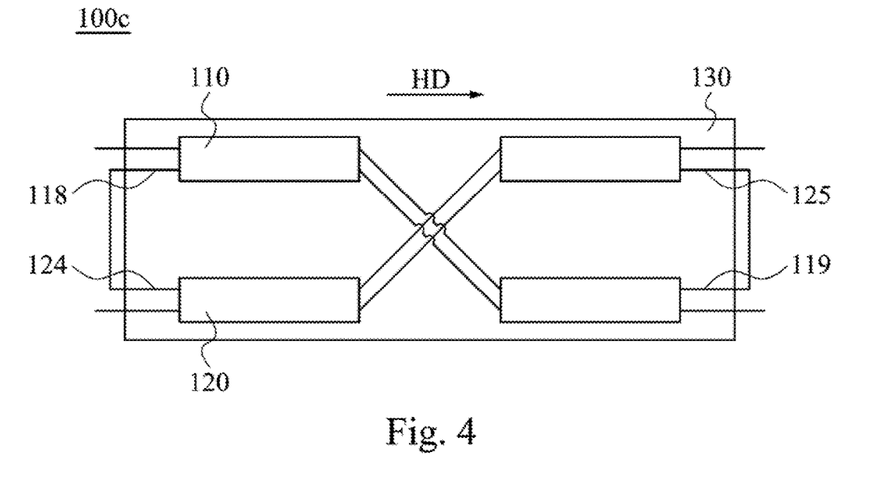
FIG. 4 is a layout diagram of a multi-channel power source according to a further embodiment of the present disclosure, in which the first power conversion unit and the second power conversion unit are connected in series.

Reference is made to FIG. 4. FIG. 4 is a layout diagram of a multi-channel power source 100c according to a further embodiment of the present disclosure, in which the first power conversion unit 110 and the second power conversion unit 120 are connected in series. In this embodiment, as shown in FIG. 4, an input 118 of the first power conversion unit 110 and an input 124 of the second power conversion unit 120 are connected in series, while an output 119 of the first power conversion unit 110 and an output 125 of the second power conversion unit 120 are connected in series. To be more specific, the connection in series of the input 118 and the input 124, and the connection in series of the output 119 and the output 125, can both be conducted outside the multi-channel power source 100c, or inside the multi-channel power source 100c, according to the actual conditions.

Figure 5:
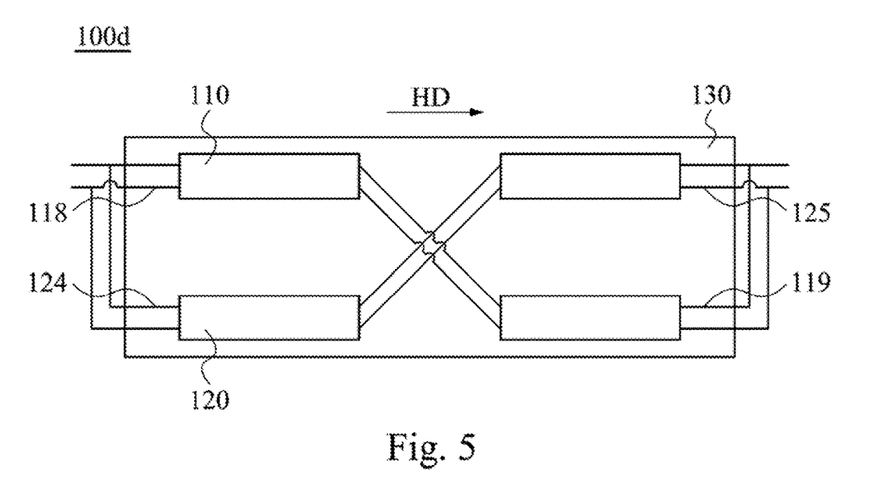
FIG. 5 is a layout diagram of a multi-channel power source according to another embodiment of the present disclosure, in which the first power conversion unit and the second power conversion unit are connected in parallel.

Reference is made to FIG. 5. FIG. 5 is a layout diagram of a multi-channel power source 100d according to another embodiment of the present disclosure, in which the first power conversion unit 110 and the second power conversion unit 120 are connected in parallel. In this embodiment, as shown in FIG. 5, an input 118 of the first power conversion unit 110 and an input 124 of the second power conversion unit 120 are connected in parallel so as to share a single input, while an output 119 of the first power conversion unit 110 and an output 125 of the second power conversion unit 120 are connected in parallel so as to share a single output. To be more specific, similarly, the connection in parallel of the input 118 and the input 124, and the connection in parallel of the output 119 and the output 125, can both be conducted outside the multi-channel power source 100d, or inside the multi-channel power source 100d, according to the actual conditions.

FIGS. 4-5 show only two ways of connection of the first power conversion unit 110 and the second power conversion unit 120. However, these do not intend to limit the present disclosure. For examples, in other embodiments, the input 118 of the first power conversion unit 110 and the input 124 of the second power conversion unit 120 are connected in series, while the output 119 of the first power conversion unit 110 and the output 125 of the second power conversion unit 120 are connected in parallel, or the input 118 of the first power conversion unit 110 and the input 124 of the second power conversion unit 120 are connected in parallel, while the output 119 of the first power conversion unit 110 and the output 125 of the second power conversion unit 120 are connected in series.

Figure 6:
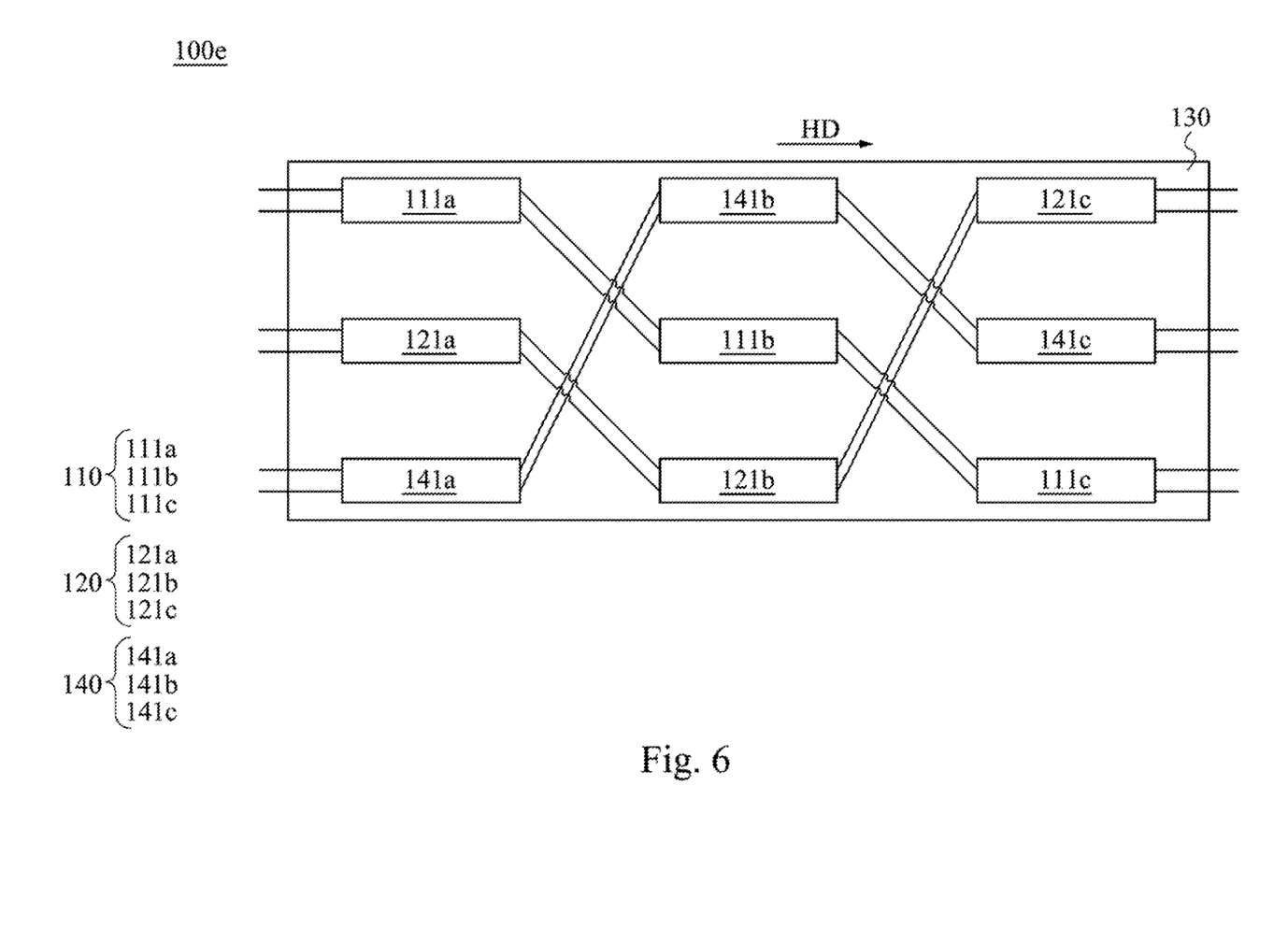
FIGS. 6-9 are layout diagrams of multi-channel power sources according to other embodiments of the present disclosure, in which each of the multi-channel power sources includes a first power conversion unit, a second power conversion unit and a third power conversion unit.

Reference is made to FIG. 6. FIG. 6 is a layout diagram of multi-channel power source 100e according to another embodiment of the present disclosure, in which the multi-channel power source 100e includes a first power conversion unit 110, a second power conversion unit 120 and a third power conversion unit 140. In this embodiment, as shown in FIG. 6, the multi-channel power source 100e further includes at least one third power conversion unit 140. The third power conversion unit 140 has a plurality of third subsidiary units, such as the third subsidiary unit 141a, the third subsidiary unit 141b and the third subsidiary unit 141c. The third subsidiary unit 141a, the third subsidiary unit 141b and the third subsidiary unit 141c are electrically connected with each other, and the third subsidiary unit 141a, the third subsidiary unit 141b and the third subsidiary unit 141c respectively have at least one third heating element (not shown). As shown in FIG. 6, the first subsidiary units (including the first subsidiary unit 111a, the first subsidiary unit 111b and the first subsidiary unit 111c), the second subsidiary units (including the second subsidiary unit 121a, the second subsidiary unit 121b and the second subsidiary unit 121c) and the third subsidiary units (including the third subsidiary unit 141a, the third subsidiary unit 141b and the third subsidiary unit 141c) are arranged in a staggered manner along the heat dissipation medium direction HD.

Figure 7:
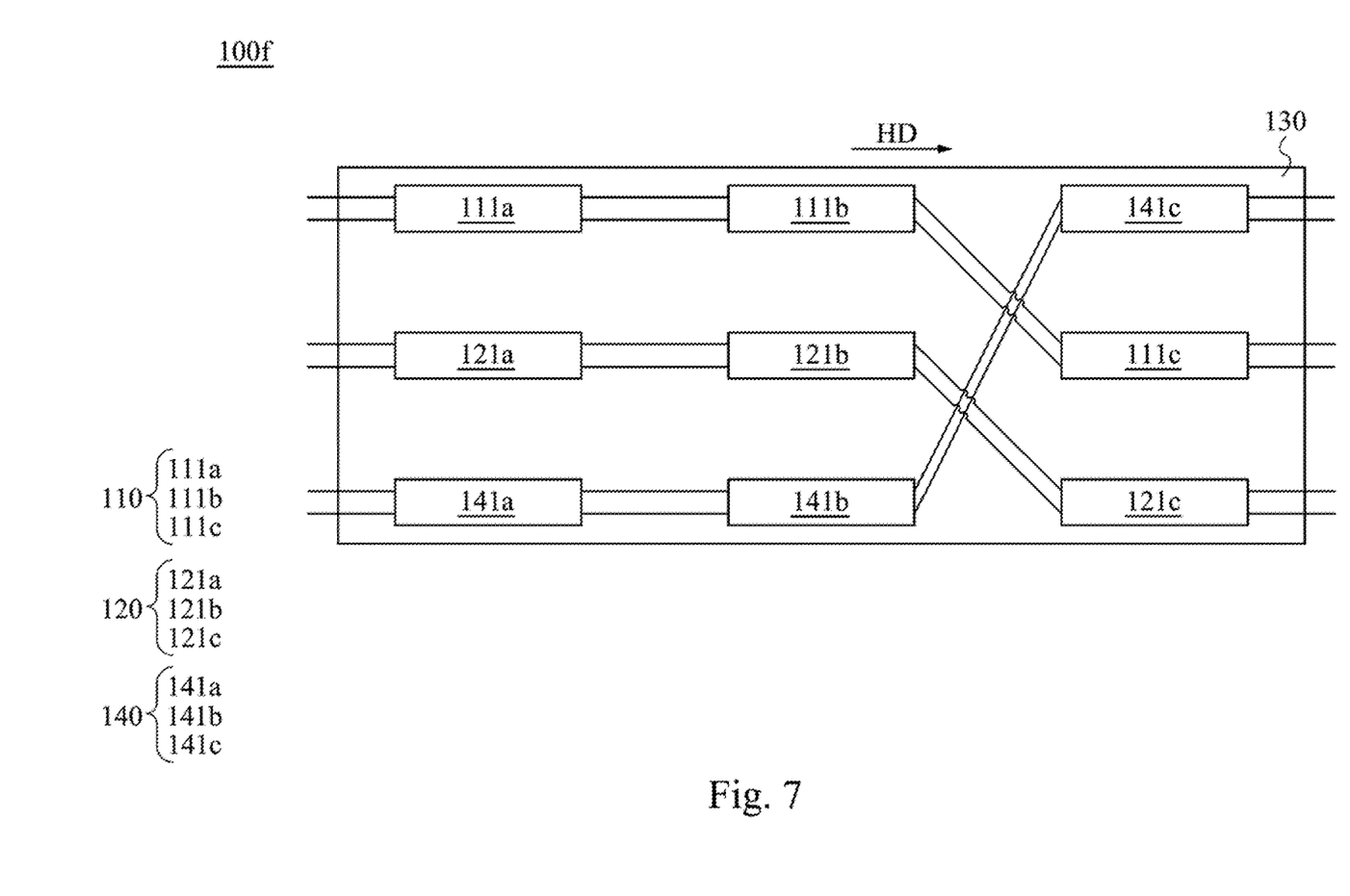

Reference is made to FIG. 7. FIG. 7 is a layout diagram of multi-channel power source 100f according to a further embodiment of the present disclosure, in which the multi-channel power source 100f includes a first power conversion unit 110, a second power conversion unit 120 and a third power conversion unit 140. In this embodiment, the first subsidiary units (including the first subsidiary unit 111a, the first subsidiary unit 111b and the first subsidiary unit 111c), the second subsidiary units (including the second subsidiary unit 121a, the second subsidiary unit 121b and the second subsidiary unit 121c) and the third subsidiary units (including the third subsidiary unit 141a, the third subsidiary unit 141b and the third subsidiary unit 141c) are only partially arranged in a staggered manner along the heat dissipation medium direction HD according to the actual conditions. For example, as shown in FIG. 7, the first subsidiary unit 111a and the first subsidiary unit 111b are arranged substantially along the heat dissipation medium direction HD, the second subsidiary unit 121a and the second subsidiary unit 121b are arranged substantially along the heat dissipation medium direction HD, the third subsidiary unit 141a and the third subsidiary unit 141b are arranged substantially along the heat dissipation medium direction HD, but only the first subsidiary unit 111c, the second subsidiary unit 121c and the third subsidiary unit 141c are mutually exchanged by position, such that the first subsidiary unit 111c, the second subsidiary unit 121c and the third subsidiary unit 141c are arranged in a staggered manner along the heat dissipation medium direction HD.

Figure 8:
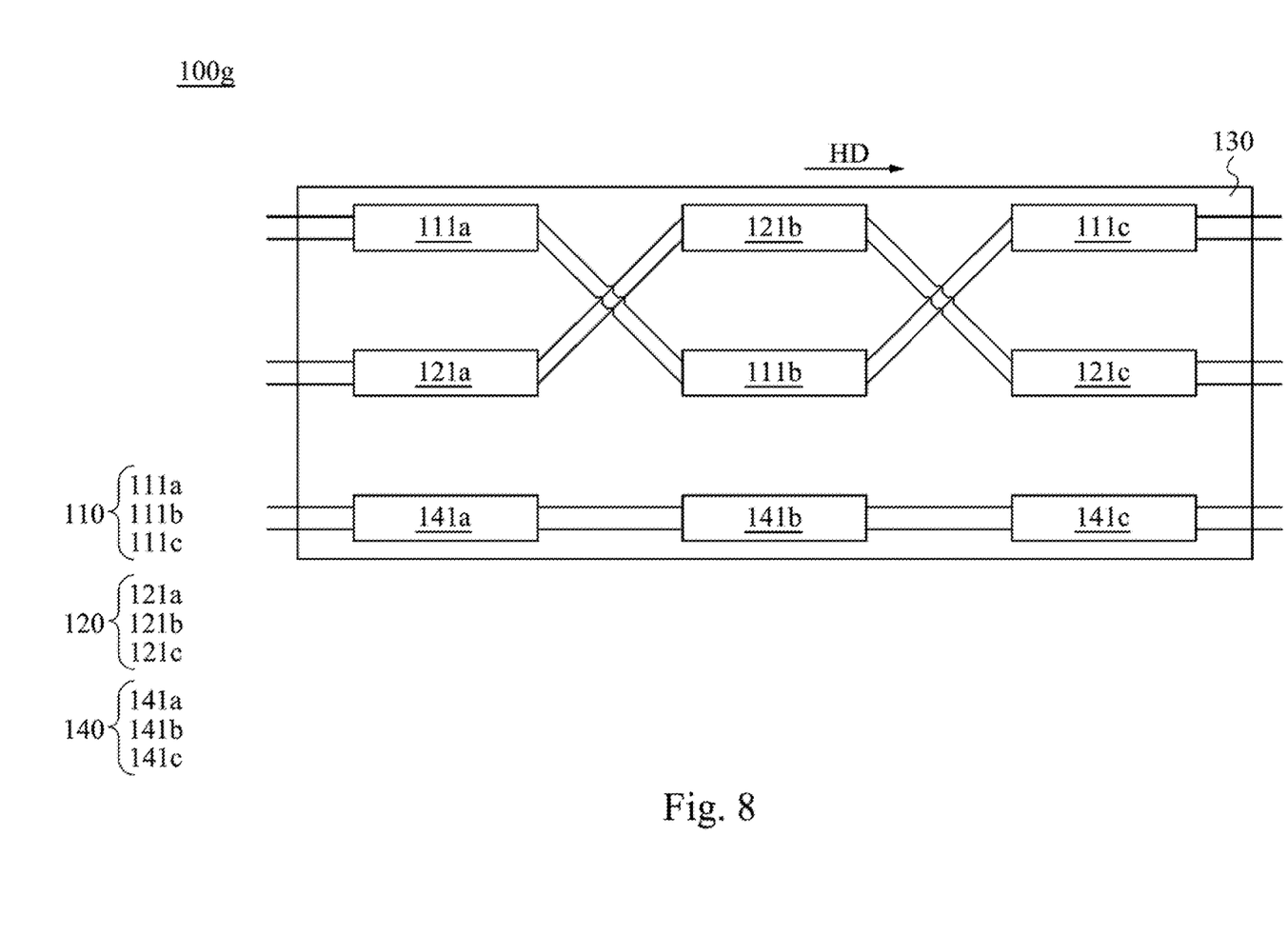

Reference is made to FIG. 8. FIG. 8 is a layout diagram of multi-channel power source 100g according to another embodiment of the present disclosure, in which the multi-channel power source 100g includes a first power conversion unit 110, a second power conversion unit 120 and a third power conversion unit 140. In this embodiment, two of the first subsidiary units (including the first subsidiary unit 111a, the first subsidiary unit 111b and the first subsidiary unit 111c), the second subsidiary units (including the second subsidiary unit 121a, the second subsidiary unit 121b and the second subsidiary unit 121c) and the third subsidiary units (including the third subsidiary unit 141a, the third subsidiary unit 141b and the third subsidiary unit 141c) are arranged in a staggered manner along the heat dissipation medium direction HD. To be more specific, as shown in FIG. 8, for example, the third subsidiary unit 141a, the third subsidiary unit 141b and the third subsidiary unit 141c are arranged substantially along the heat dissipation medium direction HD, but the first subsidiary unit 111b and the second subsidiary unit 121b are mutually exchanged by position, such that the first subsidiary unit 111b and the second subsidiary unit 121b are arranged in a staggered manner along the heat dissipation medium direction HD.

Figure 9:
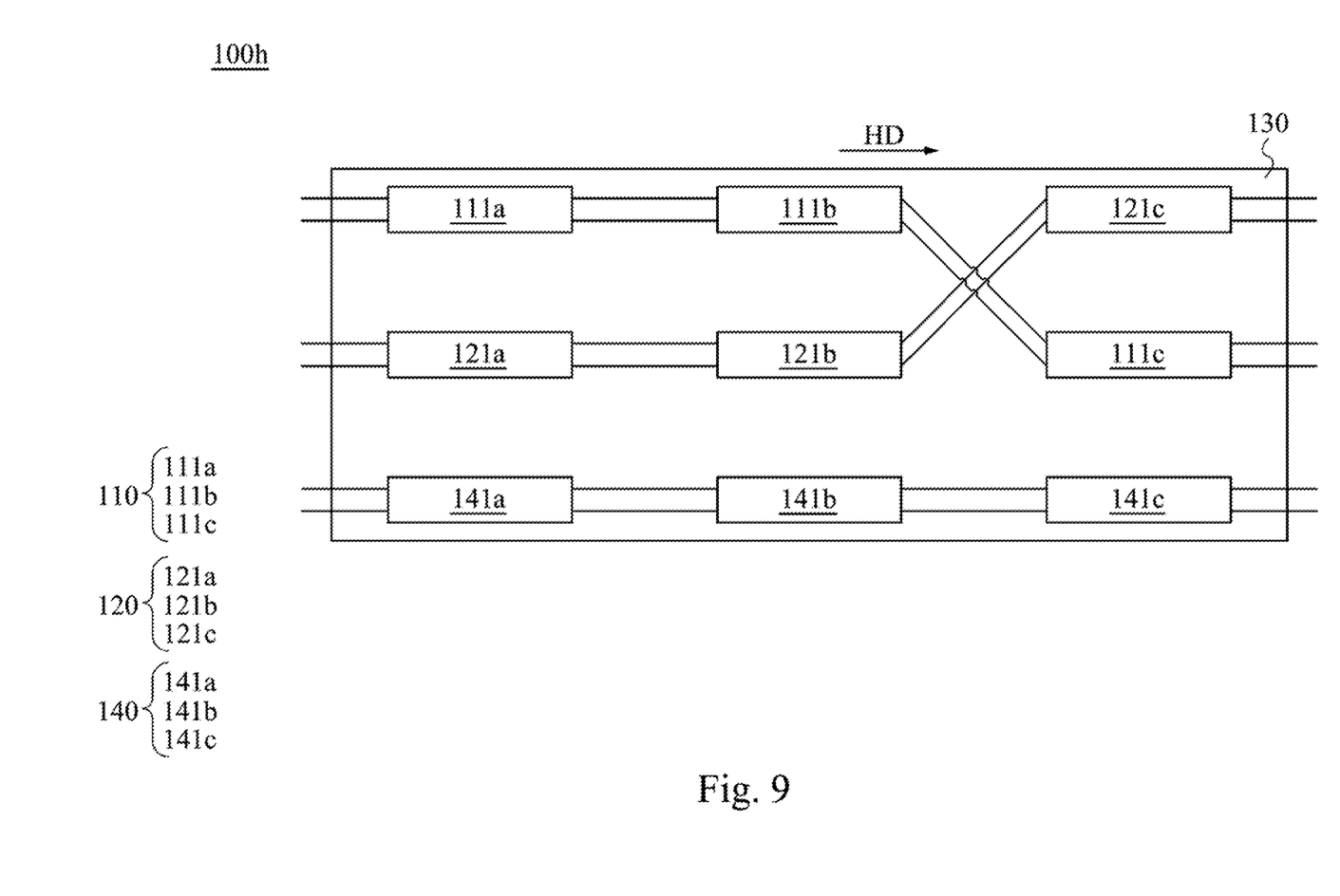
Figure 10:
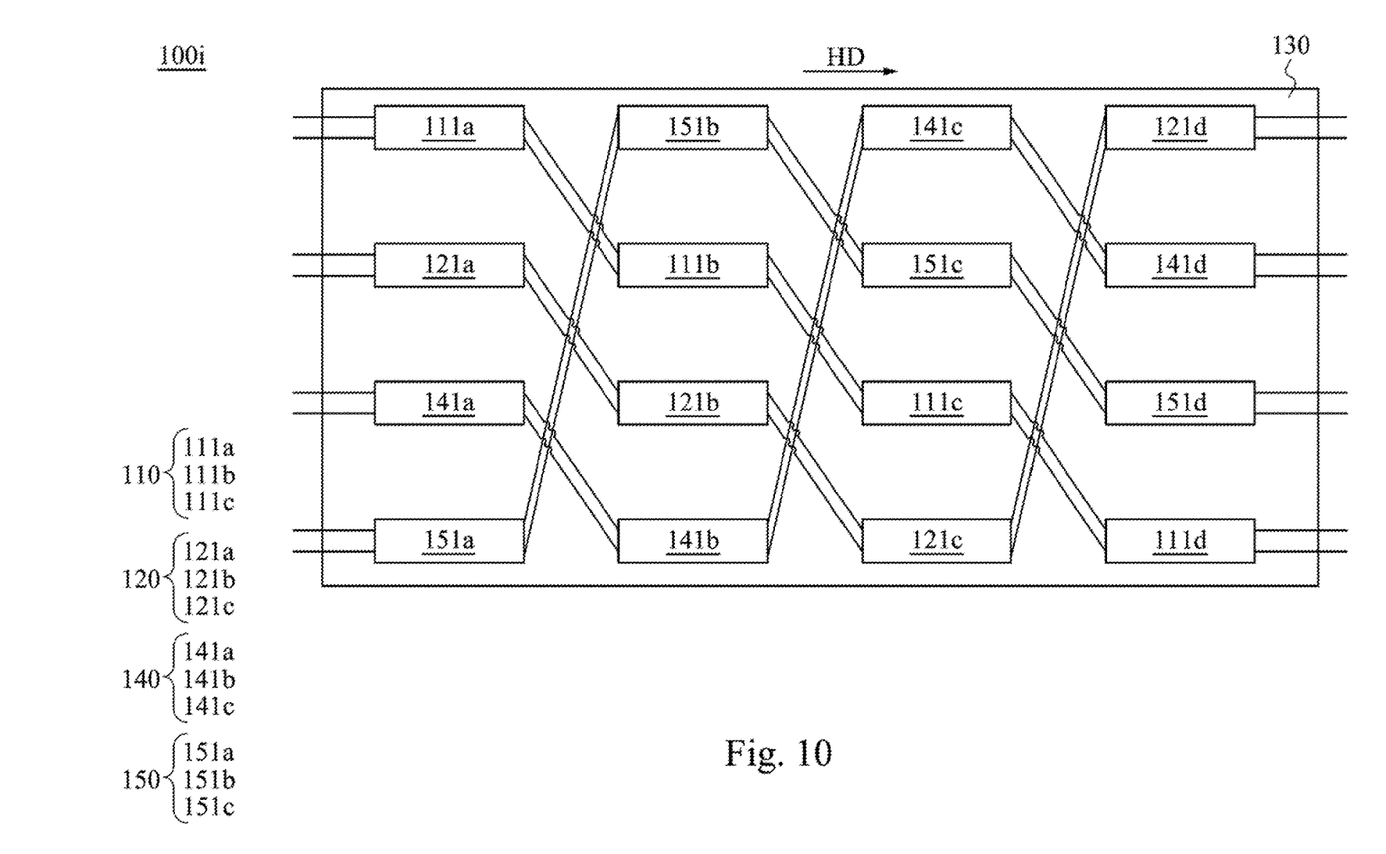
FIGS. 10-13 are layout diagrams of multi-channel power sources according to other embodiments of the present disclosure, in which each of the multi-channel power sources includes a first power conversion unit, a second power conversion unit, a third power conversion unit and a fourth power conversion unit.
Figure 11:
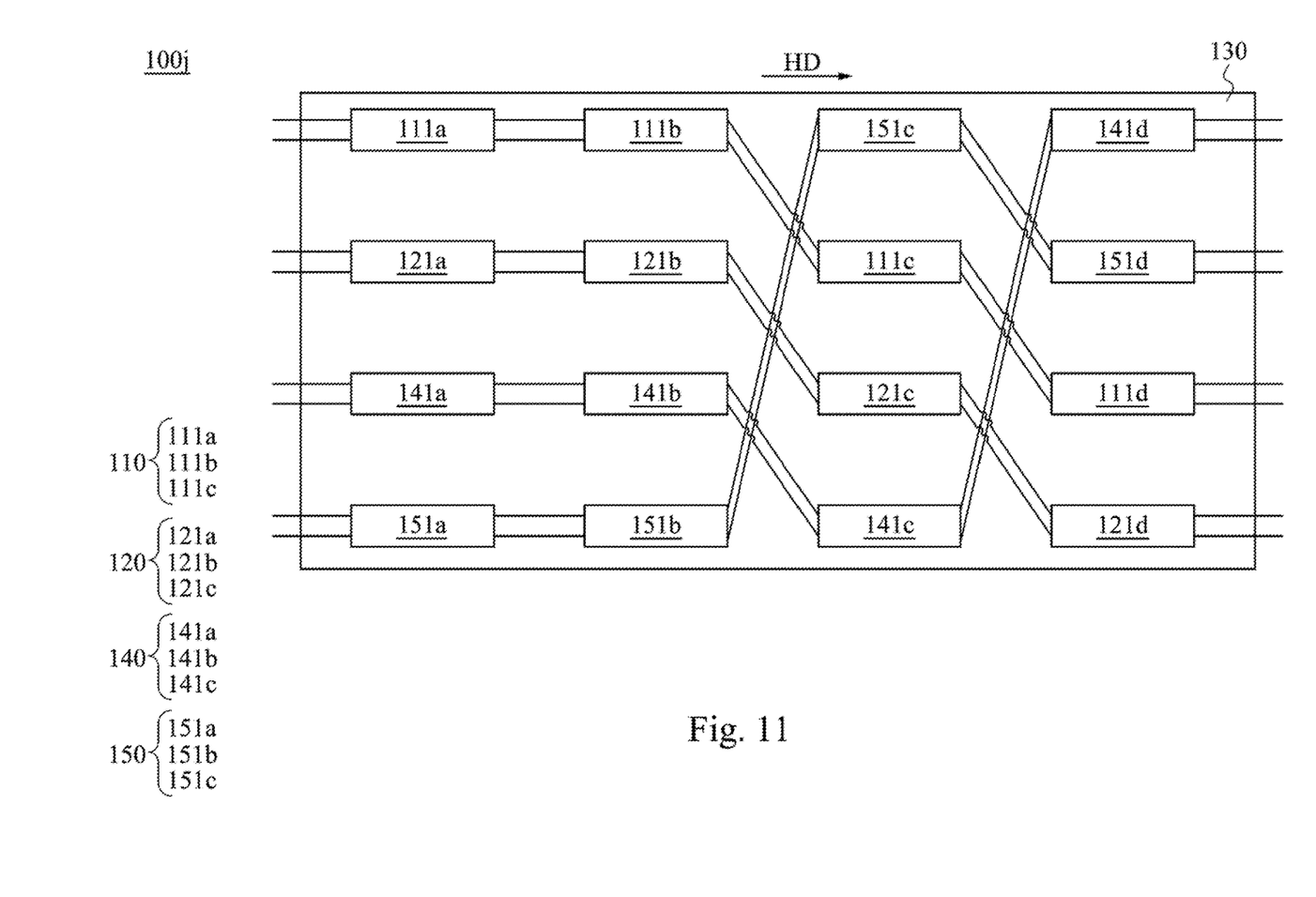
Figure 12:
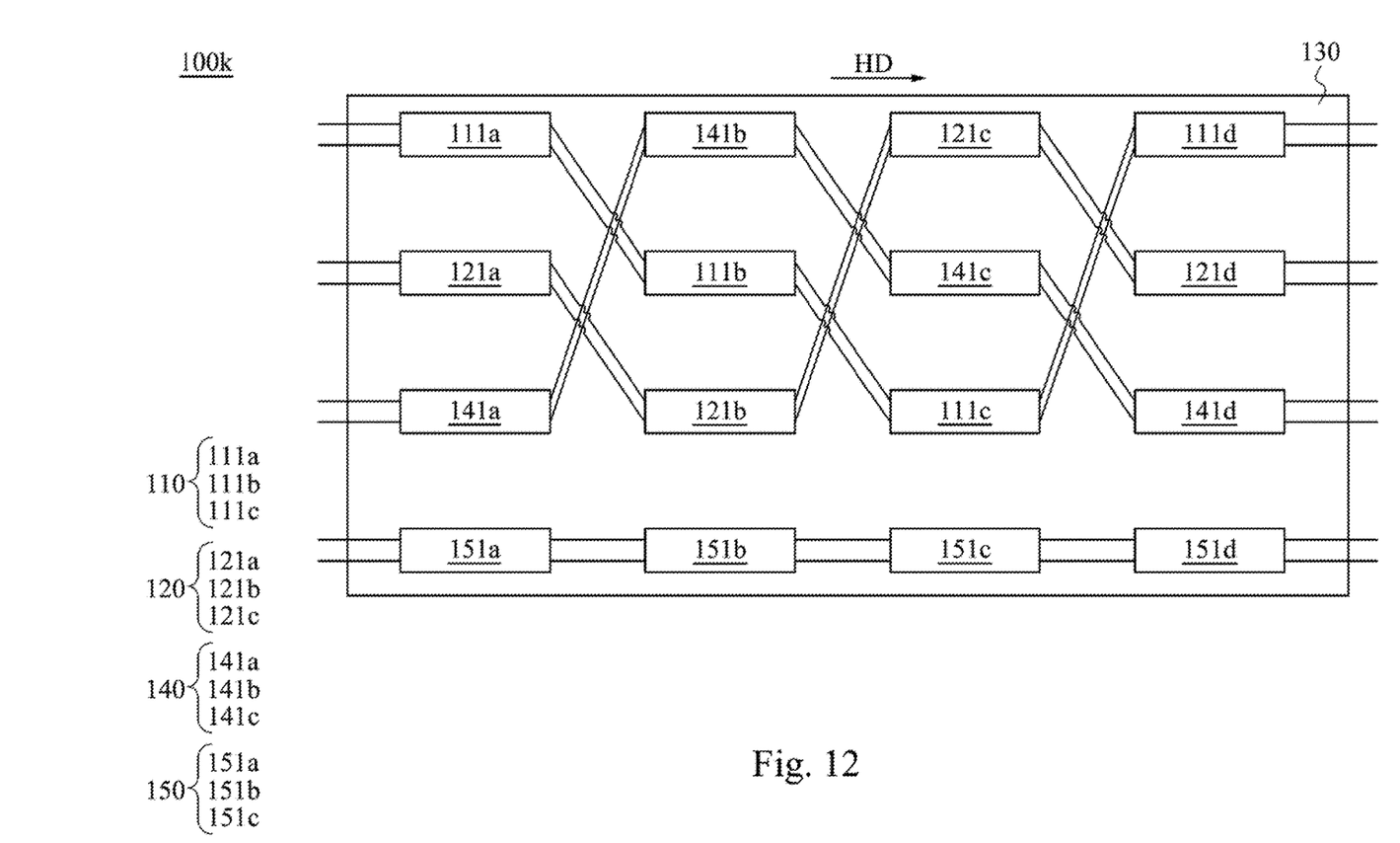
Figure 13:
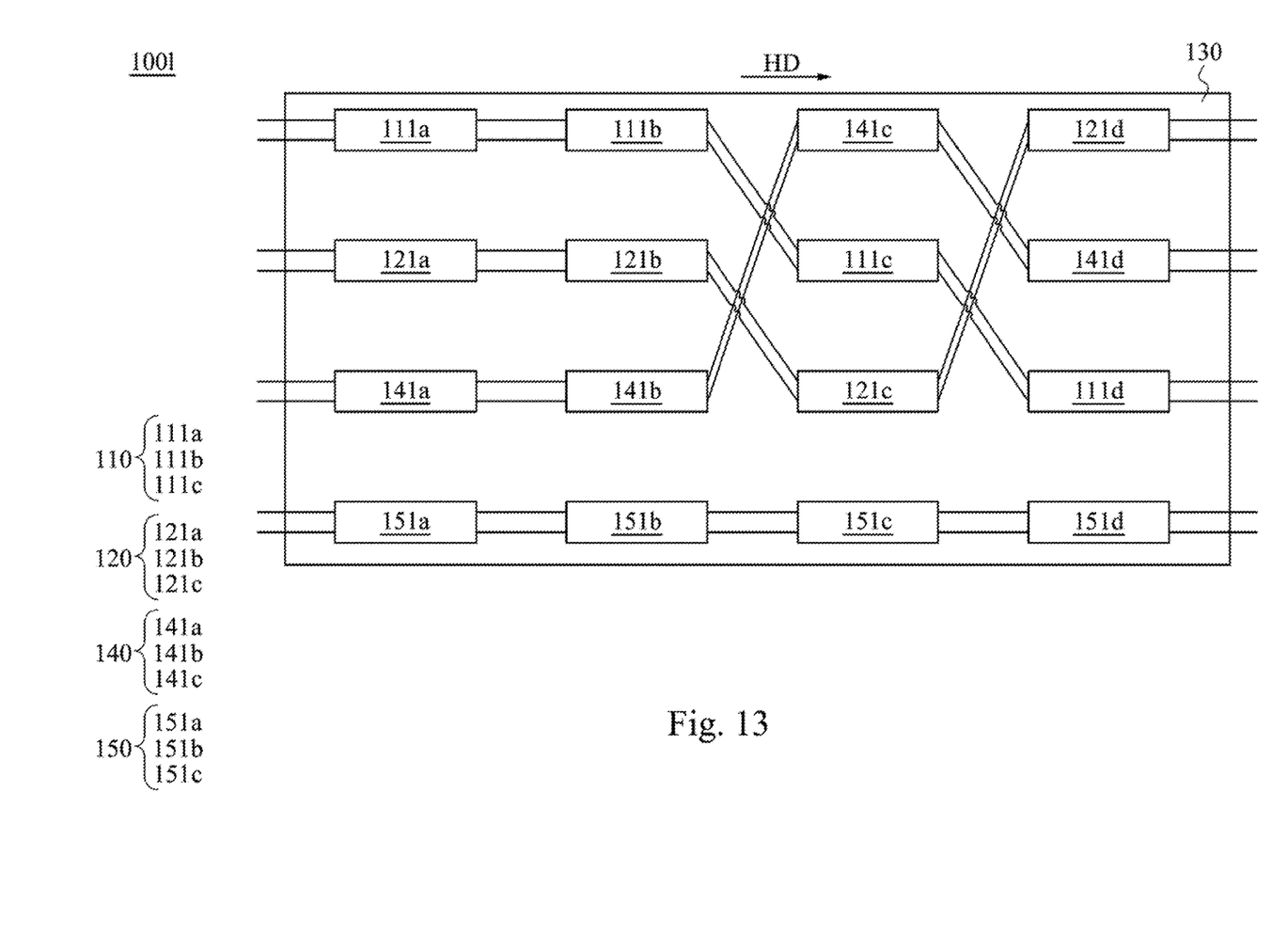

Reference is made to FIG. 9. FIG. 9 is a layout diagram of multi-channel power source 100h according to another embodiment of the present disclosure, in which the multi-channel power source 100h includes a first power conversion unit 110, a second power conversion unit 120 and a third power conversion unit 140. In this embodiment, two of the first subsidiary units (including the first subsidiary unit 111a, the first subsidiary unit 111b and the first subsidiary unit 111c), the second subsidiary units (including the second subsidiary unit 121a, the second subsidiary unit 121b and the second subsidiary unit 121c) and the third subsidiary units (including the third subsidiary unit 141a, the third subsidiary unit 141b and the third subsidiary unit 141c) are arranged in a staggered manner along the heat dissipation medium direction HD. To be more specific, as shown in FIG. 9, for example, the third subsidiary unit 141a, the third subsidiary unit 141b and the third subsidiary unit 141c are arranged substantially along the heat dissipation medium direction HD, and the first subsidiary unit 111a and the first subsidiary unit 111b are arranged substantially along the heat dissipation medium direction HD, the second subsidiary unit 121a and the second subsidiary unit 121b are arranged substantially along the heat dissipation medium direction HD, but only the first subsidiary unit 111c and the second subsidiary unit 121c are mutually exchanged by position, such that the first subsidiary unit 111c and the second subsidiary unit 121c are arranged in a staggered manner along the heat dissipation medium direction HD.

Reference is made to FIGS. 10-13. FIGS. 10-13 are layout diagrams of multi-channel power sources 100i, 100j, 100k, 100l according to other embodiments of the present disclosure, in which each of the multi-channel power sources 100i, 100j, 100k, 100l includes a first power conversion unit 110, a second power conversion unit 120, a third power conversion unit 140 and a fourth power conversion unit 150. In practical applications, apart from respectively including the third power conversion unit 140, the multi-channel power sources 100i, 100j, 100k, 100l respectively include the fourth power conversion unit 150, or even more power conversion units (not shown). For example, the first power conversion unit 110 has the first subsidiary units 111a, 111b, 111c, 111d, the second power conversion unit 120 has the second subsidiary units 121a, 121b, 121c, 121d, the third power conversion unit 140 has the third subsidiary units 141a, 141b, 141c, 141d, and the fourth power conversion unit 150 has the fourth subsidiary units 151a, 151b, 151c, 151d. According to the actual conditions, as shown in FIGS. 10-13, the first subsidiary units 111a, 111b, 111c, 111d, the second subsidiary units 121a, 121b, 121c, 121d, the third subsidiary units 141a, 141b, 141c, 141d, and the fourth subsidiary units 151a, 151b, 151c, 151d can be arranged in a staggered manner along the heat dissipation medium direction HD, or in a at least partially staggered manner along the heat dissipation medium direction HD.

In conclusion, when compared with the prior art, the aforementioned embodiments of the present disclosure have at least the following advantages:

(1) Even if the first power conversion unit and the second power conversion unit do not operate at the same period of time, or one of the first power conversion unit and the second power conversion unit does not operate or only operates with small power, the multi-channel power source is still able to achieve an even cooling effect as a whole. Thus, damage of the multi-channel power source is reduced while the conversion efficiency increased, such that the reliability of the multi-channel power source is effectively improved.

(2) If only the first power conversion unit operates and the second power conversion unit does not operate or operates with small power, before the heat dissipation device carries out the heat dissipation to the first subsidiary unit, the heat dissipation device is not configured to carry out the heat dissipation of the second subsidiary unit located at the upstream of the first subsidiary unit along the heat dissipation medium direction, or the heat dissipation device is configured to carry out the heat dissipation for the tiny heat generated by the second subsidiary unit operating with small power. As a result, the heat dissipation device still has a good cooling effect to the first subsidiary unit of the first power conversion unit.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A multi-channel power source, comprising:
   a board;
   at least one first power conversion unit having a plurality of first subsidiary units disposed above a surface of the board, the first subsidiary units having at least one first heating element;
   at least one second power conversion unit having a plurality of second subsidiary units disposed above the surface of the board, the second subsidiary units having at least one second heating element; and
   a heat dissipation device disposed on the board and configured to dissipate a heat generated by the first heating element and the second heating element along at least one heat dissipation medium direction, wherein the first subsidiary units and the second subsidiary units are arranged in an at least partially staggered manner along the heat dissipation medium direction, and a first straight line extending from one of the first subsidiary units to the other of the first subsidiary units intersects a second straight line extending from one of the second subsidiary units to the other of the second subsidiary units.

2. The multi-channel power source of claim 1, wherein the first subsidiary units and the second subsidiary units are arranged in rows.

3. The multi-channel power source of claim 1, wherein the board has at least one fluid channel within, the fluid channel is configured for allowing a heat dissipation medium to pass through at least along the heat dissipation medium direction.

4. The multi-channel power source of claim 1, wherein the heat dissipation device comprises a fan configured for driving a heat dissipation medium to pass through the first heating element and the second heating element at least along the heat dissipation medium direction.

5. The multi-channel power source of claim 1, wherein the first heating element comprises at least one electromagnetic element.

6. The multi-channel power source of claim 1, wherein the second heating element comprises at least one electromagnetic element.

7. The multi-channel power source of claim 1, wherein the first heating element comprises at least one power element.

8. The multi-channel power source of claim 1, wherein the second heating element comprises at least one power element.

9. The multi-channel power source of claim 1, wherein one of the first subsidiary units comprises a primary circuit, another one of the first subsidiary units comprises a secondary circuit.

10. The multi-channel power source of claim 1, wherein one of the first subsidiary units comprises a plurality of first power elements, another one of the first subsidiary units comprises a plurality of secondary power elements, the first power elements belong to a first circuit or a first topology, and the second power elements belong to a second circuit or a second topology.

11. The multi-channel power source of claim 1, further comprising:

at least one third power conversion unit having a plurality of third subsidiary units electrically connected with each other, each of the third subsidiary units having at least one third heating element, wherein the first subsidiary units, the second subsidiary units and the third subsidiary units are arranged in a at least partially staggered manner along the heat dissipation medium direction.

12. The multi-channel power source of claim 11, wherein two of the first subsidiary units, the second subsidiary units and the third subsidiary units are arranged along the heat dissipation medium direction in a staggered manner.

* * * * *